United States Patent
Shin

(10) Patent No.: US 10,043,854 B1
(45) Date of Patent: Aug. 7, 2018

(54) ELECTRONIC DEVICE INCLUDING TRANSISTOR AND METHOD FOR FABRICATING THE SAME

(71) Applicant: SK hynix Inc., Icheon (KR)

(72) Inventor: Jong-Han Shin, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/785,253

(22) Filed: Oct. 16, 2017

(30) Foreign Application Priority Data

Mar. 10, 2017 (KR) .......................... 10-2017-0030357

(51) Int. Cl.
| | |
|---|---|
| *H01L 29/08* | (2006.01) |
| *H01L 29/423* | (2006.01) |
| *H01L 27/22* | (2006.01) |
| *H01L 27/24* | (2006.01) |
| *H01L 29/66* | (2006.01) |

(Continued)

(52) U.S. Cl.
CPC ........ *H01L 27/228* (2013.01); *G06F 12/0875* (2013.01); *G06F 13/4282* (2013.01); *H01L 21/02532* (2013.01); *H01L 21/3065* (2013.01); *H01L 21/31116* (2013.01); *H01L 27/11507* (2013.01); *H01L 27/2436* (2013.01); *H01L 27/2463* (2013.01); *H01L 29/0649* (2013.01); *H01L 29/0847* (2013.01); *H01L 29/4236* (2013.01); *H01L 29/66636* (2013.01); *G11C 11/161* (2013.01); *H01L 27/10811* (2013.01); *H01L 27/10823* (2013.01); *H01L 27/10876* (2013.01); *H01L 43/08* (2013.01); *H01L 43/10* (2013.01); *H01L 45/1233* (2013.01)

(58) Field of Classification Search
CPC .......... H01L 29/66636; H01L 29/4236; H01L 29/0847
See application file for complete search history.

(56) References Cited

U.S. PATENT DOCUMENTS

| | | | |
|---|---|---|---|
| 6,399,973 B1 * | 6/2002 | Roberds ............ | H01L 21/76264 257/288 |
| 2005/0280052 A1 | 12/2005 | Holz et al. | |

(Continued)

OTHER PUBLICATIONS

S.Y. Han et al., "A Novel DRAM Cell Transistor Featuring a Partially-insulated Bulk FinFET (Pi-FinFET) with a pad-Polysilicon Side Contacts (PSC)", 2007 Symposium on VLSI Technology Digest of Technical Papers, 2007, pp. 166-167.

(Continued)

*Primary Examiner* — Allison P Bernstein

(57) ABSTRACT

An electronic device includes a transistor. The transistor includes: a substrate including an active region that extends in a first direction; a gate structure disposed in the substrate and crossing the active region in a second direction that crosses the first direction; recesses disposed in the active region on two sides of the gate structure in the first direction, a center of a bottom surface of a first recess being more depressed in a third direction than two edges of the bottom surface along the first direction, the third direction being perpendicular to the first and second directions; an insulating layer disposed in the first recess; and a junction layer disposed over the insulating layer in the first recess in the third direction, a top surface of the insulating layer being below the two edges of the bottom surface and having a smaller curvature than the bottom surface.

14 Claims, 13 Drawing Sheets

(51) Int. Cl.
*H01L 21/3065* (2006.01)
*H01L 21/311* (2006.01)
*H01L 21/02* (2006.01)
*H01L 27/11507* (2017.01)
*G06F 12/0875* (2016.01)
*G06F 13/42* (2006.01)
*H01L 29/06* (2006.01)
*H01L 27/108* (2006.01)
*H01L 45/00* (2006.01)
*H01L 43/08* (2006.01)
*G11C 11/16* (2006.01)
*H01L 43/10* (2006.01)

(56) References Cited

U.S. PATENT DOCUMENTS

2006/0267061 A1 11/2006 Howard
2012/0273886 A1* 11/2012 Zhong .............. H01L 29/66636
257/347

OTHER PUBLICATIONS

Jong-Man Park et al., "Fully Integrated Advanced Bulk FinFETs Architecture Featuring Partially-Insulating Technique for DRAM Cell Application of 40nm Generation and Beyond", '06 IEDM, 2006, pp. 1-4, IEEE.

Jong-Man Park et al., "A Novel Body Effect Reduction Technique to Recessed Channel Transistor Featuring Partially Insulating Layer Under Source and Drain: Application to Sub-50nm DRAM Cell", '07 IEDM, 2007, pp. 903-906, IEEE.

* cited by examiner

ELECTRONIC DEVICE INCLUDING TRANSISTOR AND METHOD FOR FABRICATING THE SAME

CROSS-REFERENCE TO RELATED APPLICATIONS

The present application claims priority to Korean Patent Application No. 10-2017-0030357, entitled "ELECTRONIC DEVICE INCLUDING TRANSISTOR AND METHOD FOR FABRICATING THE SAME" and filed on Mar. 10, 2017, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data by switching between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory including a transistor having an improved characteristic.

In an implementation, an electronic device may include a transistor, wherein the transistor may comprise: a semiconductor substrate including an active region, the active region being defined by an isolation layer and extending in a first direction; a gate structure disposed in the semiconductor substrate and crossing the active region in a second direction, the second direction crossing the first direction; recesses disposed in the active region on two sides of the gate structure in the first direction, a center of a bottom surface of a first one of the recesses being more depressed in a third direction than two edges of the bottom surface of the first recess along the first direction, the third direction being perpendicular to the first and second directions; an insulating layer disposed in the first recess; and a junction layer disposed over the insulating layer in the first recess in the third direction, wherein a top surface of the insulating layer is located below the two edges of the bottom surface of the first recess, and has a smaller curvature than the bottom surface of the first recess.

Implementations of the above device may include one or more the following.

The junction layer includes an epitaxial layer. The epitaxial layer and the semiconductor substrate include a same semiconductor material. The junction layer includes impurities, and wherein the insulating layer prevents the impurities from diffusing into a channel of the transistor. The insulating layer includes one or more of an oxide-based material, a nitride-based material, and a carbon-based material. The transistor further comprises: a contact layer located over the junction layer in the third direction. The contact layer includes a metal, a metal compound, or a metal semiconductor compound. The electronic device further comprises: a memory element coupled to the junction layer on a side of the gate structure in the first direction. The memory element includes a variable resistance element, the variable resistance element switching between different resistance states according to an applied voltage or current.

In another implementation, an electronic device may include a transistor, wherein the transistor may comprise: a semiconductor substrate including an active region, which is defined by an isolation layer and extends in a first direction; a gate structure crossing the active region in a second direction, the second direction crossing the first direction; a recess disposed in the active region on each of two sides of the gate structure in the first direction, a center and a second edge of a bottom surface of the recess being more depressed in a third direction than a first edge of the bottom surface of the recess along the first direction, the third direction being perpendicular to the first and second directions; an insulating layer disposed in the recess; and a junction layer disposed over the insulating layer in the recess in the third direction, wherein a top surface of the insulating layer is located below the first edge of the bottom surface of the recess while being located over the center and the second edge of the bottom surface of the recess.

Implementations of the above device may include one or more the following.

The gate structure is buried in the semiconductor substrate. The top surface of the insulating layer is substantially flat compared to a portion of the insulating layer that is adjacent to the first edge of the bottom surface of the recess. A portion from the center to the second edge of the bottom surface of the recess is substantially flat compared to a portion of the recess that is adjacent to the first edge of the bottom surface of the recess. The junction layer includes an epitaxial layer. The epitaxial layer and the semiconductor substrate include a same semiconductor material. The junction layer includes impurities, and wherein the insulating layer prevents the impurities from diffusing into a channel of the transistor. The insulating layer includes an oxide-based material, a nitride-based material, a carbon-based material, or a combination thereof. The transistor further comprises: a contact layer located over the junction layer in the third direction. The contact layer includes a metal, a metal compound, or a metal semiconductor compound. The electronic device further comprises: a memory element coupled to the junction layer on a side of the gate structure in the first direction. The memory element includes a variable resistance element, which switches between different resistance states according to an applied voltage or current.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the transistor is part of at least one of the control unit, the operation unit and the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the transistor is part of at least one of the core unit, the cache memory unit and the bus interface in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the transistor is part of at least one of the processor, the auxiliary memory device, the main memory device and the interface device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the transistor is part of at least one of the controller, the storage device, the temporary storage device and the interface in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the transistor is part of at least one of the memory controller, the memory, the buffer memory and the interface in the memory system.

In another implementation, a method for fabricating an electronic device including a transistor may include providing a semiconductor substrate that includes an active region, the active region being defined by an isolation layer and extending in a first direction; forming a gate structure in the semiconductor substrate, the gate structure crossing the active region in a second direction, the second direction crossing the first direction; forming a recess by etching the active region on each of two sides of the gate structure, a center of the etched active region being more depressed in a third direction than two edges of the etched active region along the first direction, the third direction being perpendicular to the first and second directions; forming an insulating layer pattern in the recess, a top surface of the insulating layer pattern being lower than the two edges of the etched active region and having a smaller curvature than a bottom surface of the recess; and forming a junction layer over the insulating layer pattern in the third direction by performing an epitaxial growth process.

Implementations of the above method may include one or more the following.

A flow rate of an etching gas used in the forming of the recess is slower than a flow rate of an etching gas used in forming another recess, the other recess having a bottom surface that has a smaller curvature than the bottom surface of the recess. A plasma bias applied in the forming of the recess is larger than a plasma bias applied in forming another recess, the other recess having a bottom surface that has a smaller curvature than the bottom surface of the recess. The forming of the insulating layer pattern includes: forming an insulating layer filling the recess; and etching an upper portion of the insulating layer so as to expose the two edges of the etched active region. A flow rate of an etching gas used in the etching of the upper portion of the insulating layer is faster than a flow rate of an etching gas used in forming another insulating layer pattern, the other insulating layer pattern having a top surface of which a center is more depressed than the top surface of the insulating layer pattern. A plasma bias applied in the etching of the upper portion of the insulating layer is smaller than a plasma bias applied in forming another insulating layer pattern, a center of a top surface of the other insulating layer pattern being more depressed than the top surface of the insulating layer pattern. The forming of the junction layer includes growing an epitaxial layer doped with impurities. The forming of the junction layer includes: growing an epitaxial layer; and doping impurities into the epitaxial layer.

In another implementation, a method for fabricating an electronic device including a transistor may include providing a semiconductor substrate that includes an active region, the active region being defined by an isolation layer and extending in a first direction; forming a gate structure crossing the active region in a second direction, the second direction crossing the first direction; forming a recess by etching the active region on each of two sides of the gate structure along the first direction, a center of the etched active region being more depressed in a third direction than two edges of the etched active region along the first direction, the third direction being perpendicular to the first and second directions; forming a final recess by etching a second portion of the etched active region to a certain depth without etching a first portion of the etched active region, the second portion being defined from the center to a second edge of the two edges of the etched active region, the first portion being defined from the center to a first edge of the two edges of the etched active region; forming an insulating layer pattern in the final recess, a top surface of the insulating layer pattern being located below the first edge of the etched active region and located over the center and the second edge of the etched active region; and forming a junction layer over the insulating layer pattern in the third direction by performing an epitaxial growth process.

Implementations of the above method may include one or more the following.

A flow rate of an etching gas used in the forming of the recess is slower than a flow rate of an etching gas used in forming another recess, a bottom surface of the other recess having a smaller curvature than the bottom surface of the recess. A plasma bias applied in the forming of the recess is larger than a plasma bias applied in forming another recess, a bottom surface of the other recess having a smaller curvature than the bottom surface of the recess. The forming of the final recess includes: forming a mask pattern, the mask pattern covering the first portion of the etched active region and exposing the second portion of the etched active region; and etching the second portion of the etched active region exposed by the mask pattern. A flow rate of an etching gas used in the etching of the second portion is faster than a flow rate of an etching gas used in the forming of the recess. A plasma bias applied in the etching of the second portion is smaller than a plasma bias applied in the forming of the recess. The forming of the final recess includes: implanting impurities into the second portion of the etched active region; and removing the impurities-implanted region. The implanting of the impurities is performed by tilted ion-implantation. The forming of the insulating layer pattern includes: forming an insulating layer filling the recess; and etching an upper portion of the insulating layer so as to expose the first edge of the etched active region. A flow rate of an etching gas used in the etching of the upper portion of the insulating layer is faster than a flow rate of an etching gas used in forming another insulating layer pattern, a center of a top surface of the other insulating layer pattern being more depressed in the third direction than the top surface of the insulating layer pattern. A plasma bias applied in the etching of the upper portion of the insulating layer is smaller than a plasma bias applied in forming another insulating layer pattern, a center of a top surface of the other insulating layer pattern being more depressed in the third direction than the top surface of the insulating layer pattern. The forming of the junction layer includes growing an epitaxial layer doped with impurities. The forming of the junction layer includes: growing an epitaxial layer; and doping impurities into the epitaxial layer.

These and other aspects, implementations and associated advantages are described in greater detail in the drawings, the description and the claims.

DETAILED DESCRIPTION

Figure 1:
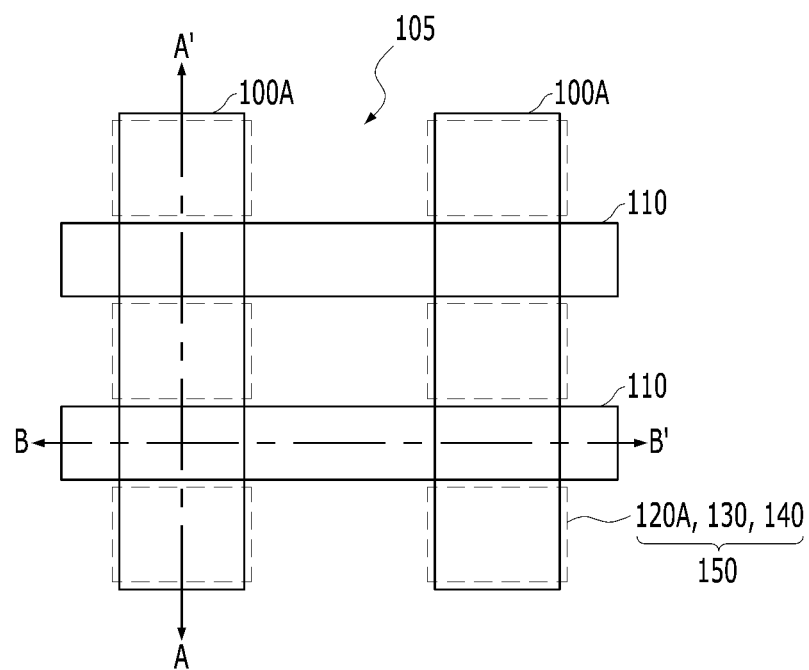
FIGS. 1 to 2G are views illustrating a transistor and a method for fabricating the same in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2A:
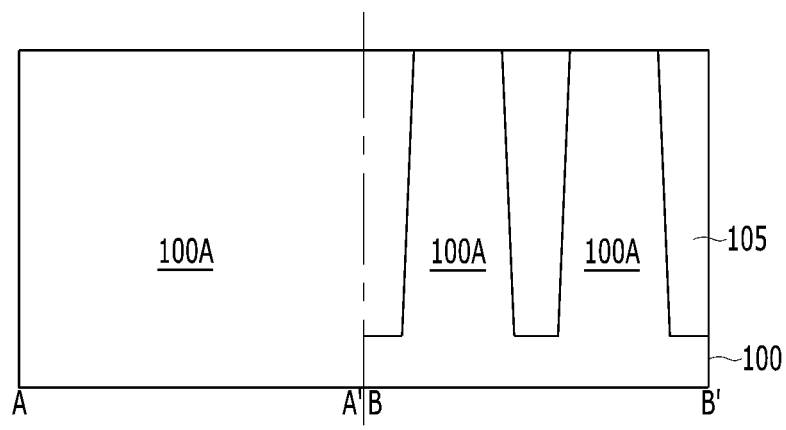
Figure 2B:
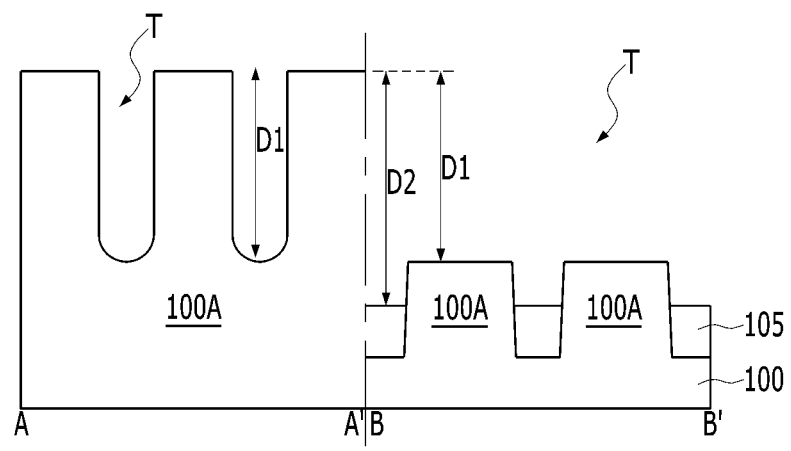
Figure 2C:
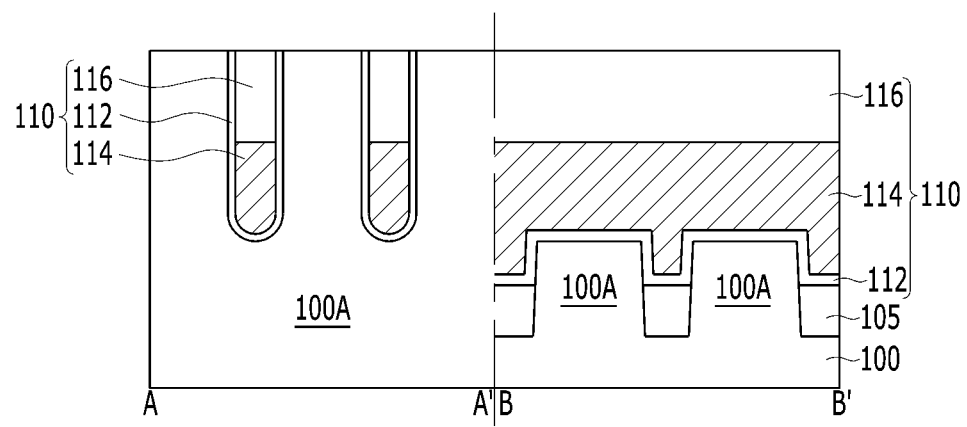
Figure 2D:
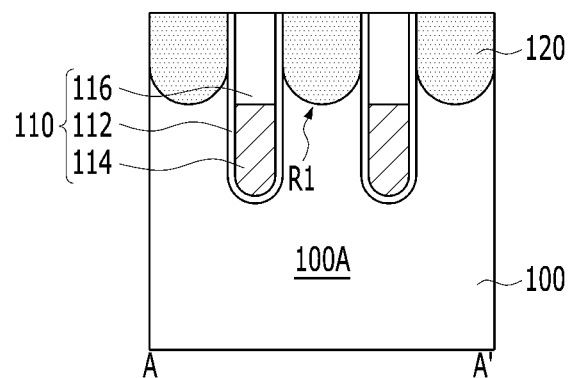
Figure 2E:
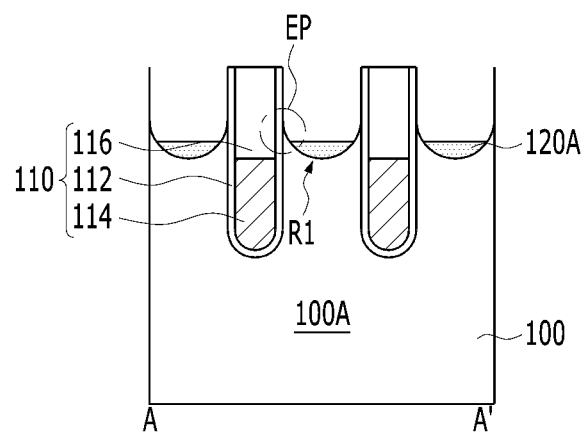
Figure 2F:
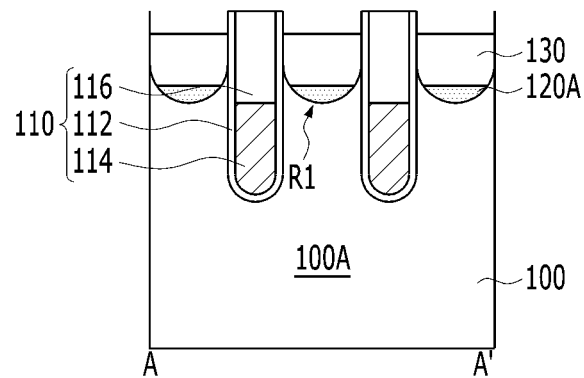
Figure 2G:
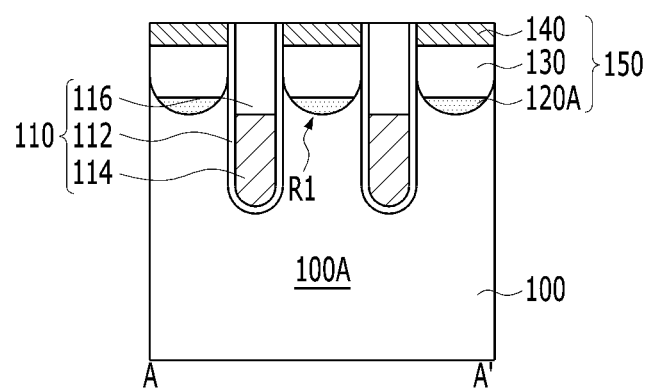

FIGS. 1 to 2G are views illustrating a transistor and a method for fabricating the same in accordance with an implementation of the present disclosure. Specifically, FIG. 1 is a plan view illustrating the transistor in accordance with the present implementation, FIG. 2G is a cross-sectional view taken along a line A-A' of FIG. 1, and FIGS. 2A to 2F are cross-sectional views illustrating intermediate processes for fabricating the transistor of FIGS. 1 and 2G. FIGS. 2A to 2F are views taken along the line A-A' and/or a line B-B' of FIG. 1. The following description will be made with reference to the cross-sectional views, but if necessary, the plan view will be referred together with the cross-sectional views.

First, the fabricating method will be described.

Referring to FIGS. 1 and 2A, a semiconductor substrate 100 may be provided. The semiconductor substrate 100 may include any of various semiconductor materials, such as silicon or the like.

Then, an isolation trench defining an active region 100A in the semiconductor substrate 100 may be formed by selectively etching a portion of the semiconductor substrate 100, and the isolation trench may be filled with an insulating material such as a silicon oxide, a silicon nitride, or the like, thereby forming an isolation layer 105 in the isolation trench. In the present implementation, the active region 100A may extend in a first direction, which is parallel to the line A-A'. A plurality of active regions 100A may be arranged to be spaced apart from each other in a second direction, which is parallel to the line B-B', the line B-B' being perpendicular to the line A-A'. The active regions 100A may have a rectangular shape having a major length in the first direction. However, the number, the shape, and the arrangement of the active regions 100A may be variously modified in accordance with other implementations.

Referring to FIGS. 1 and 2B, the active region 100A and the isolation layer 105 may be selectively etched to form a gate trench T that extends in the second direction to cross the active region 100A. The gate trench T may be formed in a gate region. A gate structure 110 may be formed in the gate trench T. In the present implementation, a plurality of gate trenches T may be arranged to be spaced apart from each other in the first direction, and each of the gate trenches T may cross all of the active regions 100A arranged in the second direction. The gate structure 110 may have a line shape. However, the number, the shape, and the arrangement of the gate trenches T may be variously modified in accordance with other implementations.

Here, when etching the active region 100A and the isolation layer 105 for forming the gate trench T, the isolation layer 105 may be etched deeper than the active region 100A. That is, a depth D2 of the gate trench T over the isolation layer 105 may be larger than a depth D1 of the gate trench T over the active region 100A. Accordingly, in the gate region, the active region 100A may protrude above the isolation layer 105. However, in other implementations, the depth D2 of the gate trench T over the isolation layer 105 may be variously modified.

Referring to FIGS. 1 and 2C, the gate structure 110 filling the gate trench T may be formed. The gate structure 110 may include a gate insulating layer 112, a gate electrode layer 114, and a gate protective layer 116. The gate insulating layer 112 is formed along an inner wall of the gate trench T. The gate electrode layer 114 fills a lower portion of the gate trench T after the gate insulating layer 112 is formed. The gate protective layer 116 fills a remaining portion of the gate trench T after the gate insulating layer 112 and the gate electrode layer 114 are formed. The gate protective layer 116 is disposed over the gate electrode layer 114.

The gate insulating layer 112 may be formed by depositing an insulating material along the inner wall of the gate trench T or performing a thermal oxidation process on the gate trench T.

The gate electrode layer 114 may be formed by providing a conductive material, such as a metal, a metal nitride, or the like, over a resultant structure including the gate insulating layer 112, and performing an etch back process to remove a portion of the conductive material until the conductive material remains at a desired height.

The gate protective layer 116 may be formed by providing an insulating material, such as a silicon oxide, a silicon nitride, or the like, over a resultant structure in which the gate insulating layer 112 and the gate electrode layer 114 are formed, and performing a planarization process, for example, a Chemical Mechanical Polishing (CMP) process, on the insulating material until a top surface of the semiconductor substrate 100 is exposed.

As a result, the gate structure 110 may cover the protruding portion of the active region 100A under the gate trench T in the second direction. Since the active region 100A has the protruding portion above the isolation layer 105, the gate structure 110 may be in contact with a top surface and side surfaces of the active region 100A, and thus a contact area between the gate structure 110 and the active region 100A may increase. Therefore, a driving ability of the transistor may be improved.

Referring to FIGS. 1 and 2D, the active region 100A located on two sides of the gate structure 110 in the first direction may be etched to a certain depth from the top surface of the semiconductor substrate 100 to form recesses R1 in the active region 100A.

Here, in the first direction, an etching depth of the active region 100A may be the smallest at two edges of the active region 100A adjacent to the gate structure 110, and may increase toward a center of a bottom surface of the etched portion of the active region 100A. In other words, a depth of a bottom surface of the recess R1 may be increase from two edges toward a center of the bottom surface of the recess R1, that is, in the first direction. Therefore, the recess R1 may have a cross section with a U-shape or similar shape along the first direction. A lowermost portion of the recess R1 may be located at a level that is the same as or similar to a top surface of the gate electrode layer 114.

The shape of the recess R1 may be modified according to an etching condition. As an example, as a flow rate of a gas used in the etching process for forming the recess R1 decreases or a plasma bias applied in the etching process increases, the shape of the recess R1 may be similar to the U-shape in which the center of the bottom surface of the recess R1 has a greater depth than the edges. On the other hand, as the flow rate of the gas used in the etching process increases or the plasma bias applied in the etching process decreases, the bottom surface of the recess R1 may be flat, such that the center of the bottom surface of the recess R1 has a similar depth to the edges. When the semiconductor substrate 100 includes silicon, the etching of the active region 100A for forming the recess R1 may be performed by using a combination of a Cl-based gas and a Br-based gas.

Then, an insulating material may be formed to completely fill the recess R1 over a resultant structure in which the recess R1 is formed, and a planarization process may be performed on the insulating material until the top surface of the semiconductor substrate 100 and/or a top surface of the gate protective layer 116 are exposed. As a result, an insulating layer 120 is formed in the recess R1.

The insulating layer 120 may prevent doped impurities included in a junction layer, which will be described later, from diffusing into a channel of the transistor, the channel being formed in a portion the active region 100A that is adjacent to the gate electrode layer 114. The insulating layer 120 may include any of various insulating materials capable of preventing diffusion of impurities, for example, an oxide-based material, a nitride-based material, a carbon-based material, or a combination thereof.

Referring to FIG. 2E, the insulating layer 120 may be etched back to form an insulating layer pattern 120A, which remains in a lower portion of the recess R1 after the etch-back process is performed on the insulating layer 120.

Here, the insulating layer 120 may be etched back so that a top surface of the insulating layer pattern 120A is located at a lower level than the two edges of the bottom surface of the recess R1 and/or than the two edges of the active region 100A in the first direction. Accordingly, two edge portions of the active region 100A may be exposed (see an 'EP' region in FIG. 2E).

Also, the insulating layer 120 may be etched back so that the top surface of the insulating layer pattern 120A has a smaller curvature than the bottom surface of the recess R1 in the first direction. As an example, the top surface of the insulating layer pattern 120A may be substantially flat.

The shape of the insulating layer pattern 120A may be modified according to an etching condition. As an example, as a flow rate of a gas used in the etching process increases or a plasma bias applied in the etching process decreases, the top surface of the insulating layer pattern 120A may have a substantially flat shape. On the other hand, as the flow rate of the gas used in the etching process decreases or the plasma bias applied in the etching process increases, the top surface of the insulating layer pattern 120A may have a shape with a depressed center. The etching process of the insulating layer 120 may be performed by using an F-based gas.

Referring to FIG. 2F, a junction layer 130 filling a lower portion of the recess R1, where the insulating layer pattern 120A is disposed, may be formed. The junction layer 130 is disposed over the insulating layer pattern 120A in a third direction, which is perpendicular to the first and second directions. The junction layer 130 may function as a junction of the transistor, that is, a source or a drain of the transistor.

Here, the junction layer 130 may include an epitaxial layer grown from the two edge portions of the active region 100A, which are exposed when forming the insulating layer pattern 120A. Accordingly, the junction layer 130 may include any of various semiconductor materials. For example, when the semiconductor substrate 100 includes silicon, the junction layer 130 may include an epitaxial silicon layer.

Furthermore, the junction layer 130 may contain impurities with a high concentration. In this case, since an interface resistance between the junction layer 130 and a contact layer, which will be described later, may decrease, operating characteristics of the transistor may be improved. The junction layer 130 contains the impurities with the high concentration because the insulating layer pattern 120A exists below the junction layer 130. If the insulating layer pattern 120A does not exist, the impurities in the junction layer 130 may not maintain the high concentration. This is because the impurities included in the junction layer 130 may diffuse into the channel of the transistor in a subsequent thermal process even if the impurities are doped with the high concentration into the junction layer 130 to reduce the interface resistance. In addition, the impurities diffused into the channel of the transistor may change characteristics of the transistor, for example, a threshold voltage. Therefore, a reliability of the transistor may be deteriorated. However, in the present implementation, the insulating layer pattern 120A may be disposed under the junction layer 130 to prevent the impurities included in the junction layer 130 from diffusing into the channel of the transistor. Therefore, the operating characteristics of the transistor may be improved, and the reliability of the transistor may be secured.

The junction layer 130 may be formed by growing a highly doped epitaxial layer. Alternatively, the junction layer 130 may be formed by growing an epitaxial layer and implanting impurities with a high concentration into the epitaxial layer. The junction layer 130 may be formed by growing an epitaxial layer to a certain level, which is lower than the top surface of the semiconductor substrate 100.

Referring to FIG. 2G, a contact layer 140 filling a remaining portion of the recess R1, where the insulating layer pattern 120A and the junction layer 130 are disposed, may be formed. The contact layer 140 may prevent inter-diffusion between the junction layer 130 and a certain element (not shown), such as a contact plug, which may be disposed over the contact layer 140 and coupled to the contact layer 140. Also, the contact layer 140 may reduce an interface resistance between the junction layer 130 and the certain element.

The contact layer 140 may include a metal-containing material. The metal-containing material may include not only a metal layer but also a metal compound layer such as a metal nitride. Furthermore, the metal-containing material may include a metal semiconductor compound layer such as a metal silicide.

The contact layer 140 may be formed by providing a metal-containing material over a resultant structure, which includes the insulating layer pattern 120A and the junction layer 130, and performing a planarization process on the metal-containing material until the top surface of the semiconductor substrate 100 is exposed. When the contact layer 140 includes a metal semiconductor compound layer such as a metal silicide, a thermal treatment process may be further performed after providing the metal-containing material and performing the planarization process on the metal-containing material.

By the aforementioned processes, the transistor shown in FIGS. 1 and 2G may be fabricated.

Referring again to FIGS. 1 and 2G, the transistor according to the present implementation may include the gate structure 110, which is formed in the semiconductor substrate 100 including the active region 100A defined by the isolation layer 105 and extends in the second direction to cross the active region 100A; the recess R1, which is formed in the active region 100A on the two sides of the gate structure 110 in the first direction; and a stack structure 150, which fills the recess R1 and includes the insulating layer pattern 120A, the junction layer 130, and the contact layer 140.

One gate structure 110, two junction layers 130 located on two sides of the one gate structure 110 in the first direction, and two contact layers 140 located over the two junction layers 130 may form one transistor. Here, one of the two junction layers 130 may function as a source of the transistor, and the other of the two junction layers 130 may function as a drain of the transistor. FIG. 1 shows four transistors, and FIG. 2G shows two transistors.

One junction layer 130 located between two gate structures 110, which are adjacent to each other in the first direction, may function as a common source region of two transistors, and two junction layers 130 located on two sides of the two gate structures 110 in the first direction may function as two drain regions of the two transistors, respectively.

Here, the recess R1 may have a cross section of a U-shape or similar shape in which a depth of a bottom surface of the recess R1 increases from two edges toward the center of the bottom surface of the recess R1, that is, along the first direction. On the other hand, the top surface of the insulating layer pattern 120A may have a smaller curvature than the bottom surface of the recess R1, and may be located at a lower level than two edges of the bottom surface of the recess R1. Accordingly, two edge portions of the active region 100A under the recess R1 may be exposed when forming the insulating layer pattern 120A. The bottom surface of the recess R1, that is, the bottom surface of the insulating layer pattern 120A may be substantially level with the top surface of the gate electrode layer 114, so that the insulating layer pattern 120A prevents impurities in the junction layer 130 from diffusing into the channel of the transistor.

The junction layer 130 may include an epitaxial layer, which is formed by an epitaxial growth process and doped with impurities. The junction layer 130 may be located over the insulating layer pattern 120A and may be in contact with the two edge portions of the active region 100A, which are exposed when forming the insulating layer pattern 120A. In the present implementation, the top surface of the junction layer 130 may be located under the top surface of the gate protective layer 116. However, a height of the top surface of the junction layer 130 may be variously modified. For example, the top surface of the junction layer 130 may be located at a height that is substantially the same as or higher than the top surface of the gate protective layer 116.

The contact layer 140 may be located over the junction layer 130 and include a metal-containing material having a low resistance. In the present implementation, the top surface of the contact layer 140 may be located at substantially the same level as the top surface of the gate protective layer 116. However, a height of the top surface of the contact layer 140 may be variously modified. For example, the top surface of the contact layer 140 may be located lower than or higher than the top surface of the gate protective layer 116. If necessary, the contact layer 140 may be omitted.

By the aforementioned transistor and the fabricating method thereof described with reference to FIGS. 1 to 2G, a concentration of impurities contained in the junction layer 130 may be greatly increased since the impurities in the junction layer 130 may be prevented from diffusing into the channel of the transistor by forming the insulating layer pattern 120A under the junction layer 130. Therefore, operating characteristics of the transistor may be improved, and the reliability of the transistor may be secured. Furthermore, the desired shapes of the insulating layer pattern 120A and the junction layer 130 may be obtained by two etching processes and one epitaxial growth process, without performing an additional mask process. Therefore, fabricating processes may be simplified, and thus a fabrication cost may be reduced.

The above transistor may be used in various electronic devices, in particular, a semiconductor memory. For example, a semiconductor memory may include a cell array in which a plurality of memory cells for storing data is arranged. Each memory cell may include a memory element, in which data is actually stored, and an access element for controlling an access to the memory element. The above transistor may be used as the access element. Specially, the above transistor may be used as an access element coupled to a memory element which requires a high operating current. For example, the above transistor may be coupled to a variable resistance element, such as a magnetic resistance element, which requires a high current when switching between a high resistance state and a low resistance state. Hereinafter, the transistor coupled to a memory element will be described with reference to drawings in more detail.

Figure 3:
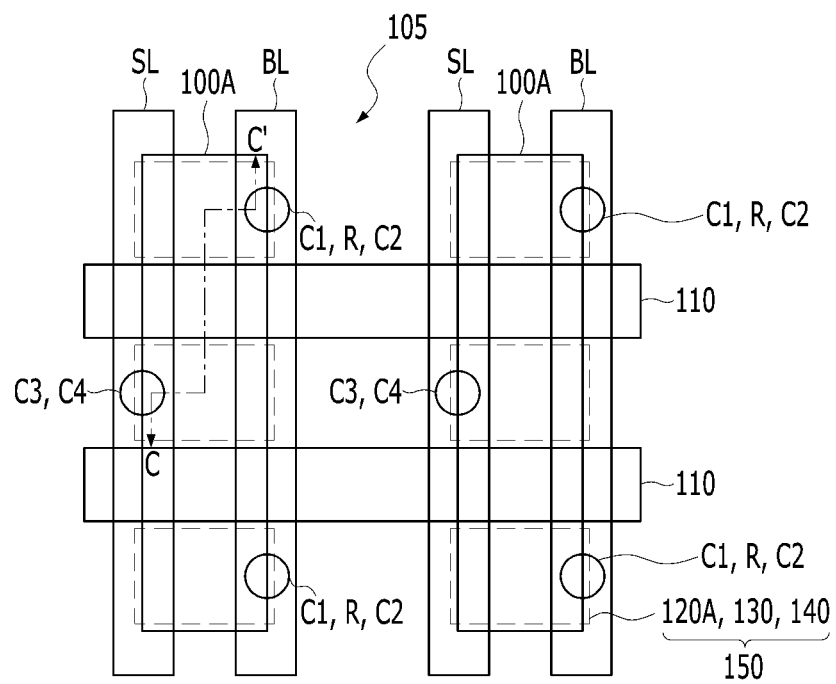
FIG. 3 is a plan view illustrating a semiconductor memory in accordance with an implementation of the present disclosure.
Figure 4:
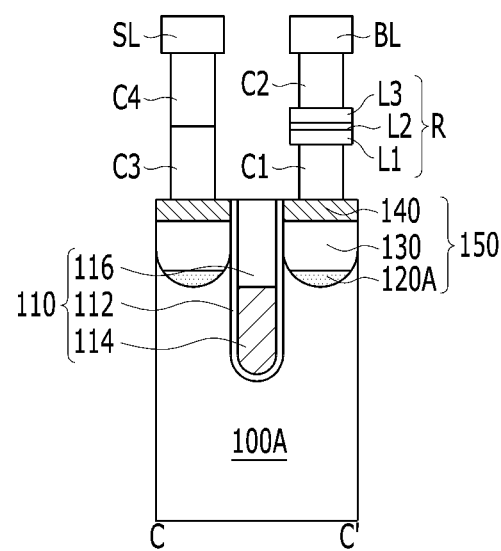
FIG. 4 is a cross-sectional view taken along a line C-C' of FIG. 3.

FIG. 3 is a plan view illustrating a semiconductor memory in accordance with an implementation of the present disclosure, and FIG. 4 is a cross-sectional view taken along a line C-C' of FIG. 3.

Referring to FIGS. 3 and 4, the semiconductor memory may include the aforementioned transistor shown in FIGS. 1 and 2G, a variable resistance element R having a lower end coupled to one junction of the transistor, a bit line BL coupled to an upper end of the variable resistance element R, and a source line SL having a lower end coupled to the other junction of the transistor. Specifically, the lower end of the variable resistance element R may be coupled to one of the stack structures 150 located on the two sides of the gate structure 110, wherein each of the stack structures 150 includes the insulating layer pattern 120A, the junction layer 130, and the contact layer 140. The lower end of the source line SL may be coupled to the other of the stack structures 150 located on the two sides of the gate structure 110. For example, when the lower end of the variable resistance element R is coupled to a first stack structure located between first and second gate structures, the lower end of the source line SL is coupled to a second stack structure located between the second gate structure and a third gate structures, the first to third gate structures being adjacent to each other in the first direction, the first and second stack structures being located on two sides of the second gate structure.

The variable resistance element R may be coupled to the contact layer 140 through a first contact C1, which penetrates through an interlayer insulating layer (not shown), and the bit line BL may be coupled to the variable resistance element R through a second contact C2, which penetrates through the interlayer insulating layer. The source line SL may be coupled to the contact layer 140 through a third contact C3 and a fourth contact C4, which penetrate through the interlayer insulating layer. The first contact C1 and the third contact C3 may be formed by the same process. For example, the first contact C1 and the third contact C3 may be formed by an etching process using the same mask and a filling process of a conductive material. Similarly, the second contact C2 and the fourth contact C4 may be formed by the same process.

Here, as shown in FIG. 3, the first contact C1, the variable resistance element R, the second contact C2 and the bit line BL may be formed to be biased toward one side, for example, a right side, of the active region 100A, in the second direction. Conversely, as shown in FIG. 3, the third contact C3, the fourth contact C4 and the source line SL may be formed to be biased toward the other side, for example, a left side, of the active region 100A, in the second direction. The bit line BL and the source line SL extend in the first direction and are spaced apart from each other in the second direction. Accordingly, a space between a first stack structure and a second stack structure may be secured to prevent an electrical short between the first and second stack structures. The first stack structure includes the first contact C1, the variable resistance element R, the second contact C2, and the bit line BL. The second stack structure includes the third contact C3, the fourth contact C4, and the source line SL.

Meanwhile, the variable resistance element R can switch between different resistance states according to a voltage or current applied through the transistor coupled to its lower end and the bit line BL coupled to its upper end. The variable resistance element R may have a single-layered structure or a multi-layered structure, including one or more of various materials used in an RRAM, a PRAM, an FRAM, an MRAM, or the like. For example, the materials may include a metal oxide such as a transition metal oxide or a perovskite-based material, a phase-change material such as a chalcogenide-based material, a ferroelectric material, a ferromagnetic material, and the like. The variable resistance element R may store different data according to its resistance states.

In the present implementation, the variable resistance element R may include a Magnetic Tunnel Junction (MTJ) element, which includes a first magnetic layer L1, a tunnel barrier layer L2, and a second magnetic layer L3. In this case, one of the first magnetic layer L1 and the second magnetic layer L3 may function as a pinned layer of which a magnetization direction is fixed, and the other of the first magnetic layer L1 and the second magnetic layer L3 may function as a free layer of which a magnetization direction is changeable. The first magnetic layer L1 and the second magnetic layer L3 may have a single-layered structure or a multi-layered structure, including one or more of various ferromagnetic materials. The ferromagnetic materials may include a Fe—Pt alloy, a Fe—Pd alloy, a Co—Pd alloy, a Co—Pt alloy, a Fe—Ni—Pt alloy, a Co—Fe—Pt alloy, a Co—Ni—Pt alloy, and the like. The tunnel barrier layer L2 may change the magnetization direction of the free layer by allowing tunneling of electrons if necessary, for example, during a data writing operation in which the resistance state of the variable resistance element R is changed. The tunnel barrier layer L2 may have a single-layered structure or a multi-layered structure, including an oxide such as MgO, CaO, SrO, TiO, VO, NbO, or the like. When the magnetization direction of the free layer and the magnetization direction of the pinned layer are parallel to each other, the variable resistance element R may be in a low resistance state. When the magnetization direction of the free layer and the magnetization direction of the pinned layer are anti-parallel to each other, the variable resistance element R may be in a high resistance state. Here, a relatively high current may be required to change the magnetization direction of the free layer, and this requirement may be satisfied by using the transistor of the present implementation.

However, the present implementation is not limited thereto, and various memory elements capable of storing data, for example, a capacitor, may be coupled to one end of the transistor of the present implementation.

The aforementioned semiconductor memory may be fabricated by using the transistor, which has an improved performance, for example, an increased operating current. Therefore, operating characteristics of the semiconductor memory may be improved.

Meanwhile, the transistor and the fabricating method thereof shown in FIGS. 1 to 2G may be variously modified. This will be described with reference to FIGS. 5 to 7B.

Figure 5:
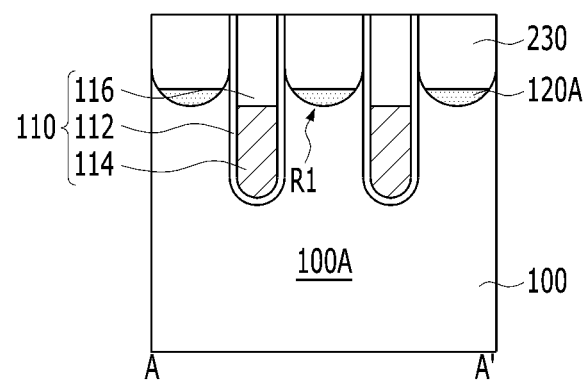
FIG. 5 is a view illustrating a transistor and a method for fabricating the same in accordance with another implementation of the present disclosure.

FIG. 5 is a view illustrating a transistor and a method for fabricating the same in accordance with another implementation of the present disclosure. Differences from the transistor and the fabricating method thereof shown in FIGS. 1 to 2G will be mainly described.

Referring to FIG. 5, after performing the aforementioned processes described with reference to FIGS. 2A to 2E, a junction layer 230 may be formed by performing an epitaxial growth process.

Here, the junction layer 230 may be formed to completely fill a remaining portion of a recess R1, in which an insulating layer pattern 120A is formed. For this, conditions of the epitaxial growth process, for example, a growth time, or the like, may be controlled. Accordingly, a top surface of the junction layer 230 may be located at a height that is substantially the same as or higher than a top surface of a semiconductor substrate 100 and/or a top surface of a gate protective layer 116. When the top surface of the junction layer 230 is located at the same height as the top surface of the semiconductor substrate 100 and/or the top surface of the gate protective layer 116, an epitaxial layer may grow to a volume sufficient for filling the recess R1, and then, a planarization process may be further performed on the epitaxial layer.

In the present implementation shown in FIG. 5, the contact layer 140 of FIG. 2G may be omitted. Alternatively, the contact layer 140 may be formed over the junction layer 230 to be located above the gate protective layer 116.

FIGS. 6A to 6E are views illustrating a transistor and a method for fabricating the same in accordance with another implementation of the present disclosure. Differences from the transistor and the fabricating method thereof shown in FIGS. 1 to 2G will be mainly described.

Figure 6A:
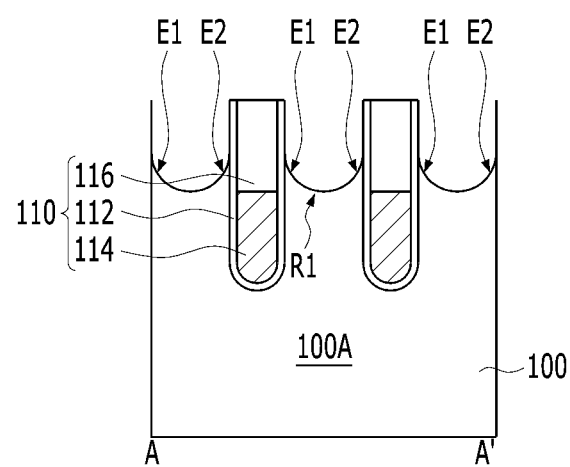
FIGS. 6A to 6E are views illustrating a transistor and a method for fabricating the same in accordance with another implementation of the present disclosure.

Referring to FIG. 6A, a gate structure 110 may be formed in a semiconductor substrate 100 by performing the aforementioned processes described with reference to FIGS. 2A to 2C.

Then, an active region 100A located on two sides of the gate structure 110 in a first direction parallel to a line A-A' may be etched to a certain depth to form a recess R1 in the active region 100A.

Here, in the first direction, the recess R1 may have a cross section of a U-shape in which a depth of a bottom surface of the recess R1 increases from two edges of the bottom surface of the recess R1 toward a center of the bottom surface of the recess R1. Hereinafter, for convenience of description, one edge of the two edges of the bottom surface of the recess R1, for example, a left edge, may be referred to as a first edge E1, and the other edge of the two edges of the bottom surface of the recess R1, for example, a right edge, may be referred to as a second edge E2. The first edge E1 and the second edge E2 may be located at substantially the same height.

Figure 6B:
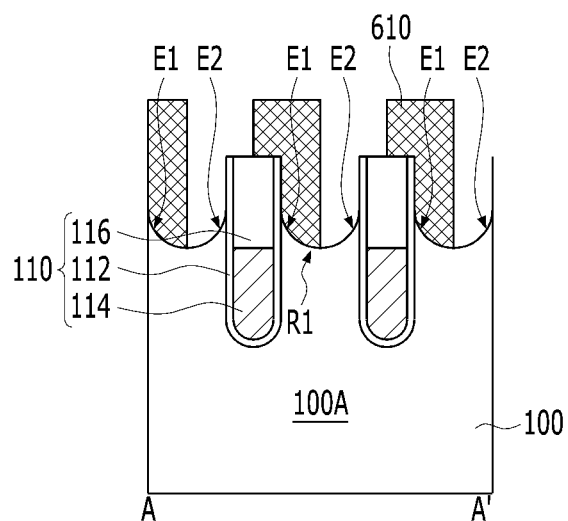

Referring to FIG. 6B, a mask pattern 610 covering the first edge E1 of the bottom surface of the recess R1 and exposing the second edge E2 may be formed over a resultant structure of FIG. 6A. In another implementation, the mask pattern 610 may be formed to expose the first edge E1 and cover the second edge E2.

In the present implementation, the mask pattern 610 may be formed to cover one half, for example, a left half, of the recess R1 and one half, for example, a right half, of the gate structure 110 while exposing the other half, for example, a right half, of the recess R1 and the other half, for example, a left half, of the gate structure 110.

Figure 6C:
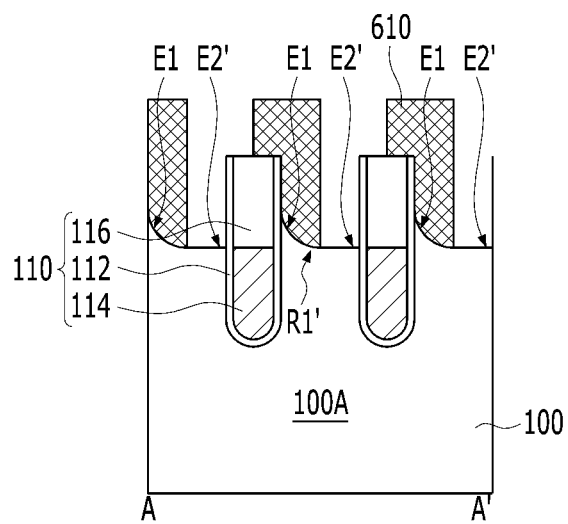

Referring to FIG. 6C, a portion of the active region 100A exposed by the mask pattern 610 may be removed by an etching process. Accordingly, a height of the first edge E1 may be maintained, but a height of the second edge E2 may be lowered. As a result, a final recess R1', which has the first edge E1 and a final second edge E2' having a lower height than the second edge E2, may be obtained. The final second edge E2' may be located below the first edge E1.

Here, the etching process of the portion of the active region 100A for forming the final recess R1' may be performed so that a portion of a bottom surface of the final recess R1', which is exposed by the mask pattern 610, has a smaller curvature than a portion of the bottom surface of the final recess R1', which is covered by the mask pattern 610. For example, the portion exposed by the mask pattern 610 may have a substantially flat shape. For example, a flow rate of a gas used in the etching process for forming the final recess R1' may be faster than a flow rate of a gas used in the etching process for forming the recess R1. Alternatively, for example, a plasma bias applied in the etching process for forming the final recess R1' may be smaller than a plasma bias applied in the etching process for forming the recess R1. The gas used in the etching process for forming the final recess R1' may be the same as the gas used in the etching process for forming the recess R1.

Figure 6D:
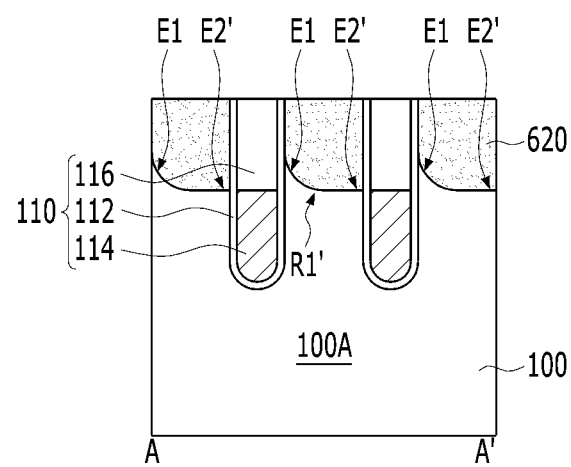

Referring to FIG. 6D, the mask pattern 610 may be removed.

Then, an insulating material may be formed to sufficiently fill the final recess R1' over a resultant structure in which the final recess R1' is formed, and a planarization process may be performed on the insulating material until a top surface of the semiconductor substrate 100 and/or a top surface of the gate protective layer 116 are exposed. As a result, an insulating layer 620 filling the final recess R1' is formed. A bottom surface of the insulating layer 620 may have a cross section with an asymmetrical shape having one side located at a higher position than the other side along the first direction.

Figure 6E:
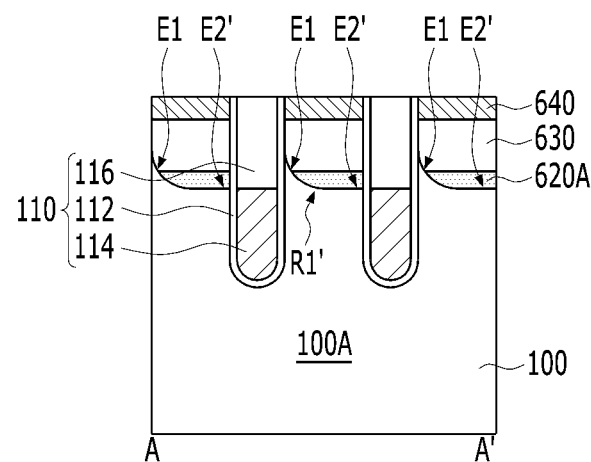

Referring to FIG. 6E, a portion of the insulating layer 620 may be removed, and thus an insulating layer pattern 620A is formed.

Here, the etching of the insulating layer 620 may be performed so that a top surface of the insulating layer pattern 620A is located at a lower level than the first edge E1 of the bottom surface of the final recess R1' and at a higher level than the final second edge E2'. Accordingly, one edge portion, for example, a left edge portion, of the active region 100A in the first direction may be exposed.

Also, the etching of the insulating layer 620 may be performed so that the top surface of the insulating layer pattern 620A has a smaller curvature than one half, e.g., a left half, of the bottom surface of the final recess R1' that includes the first edge E1. As an example, the top surface of the insulating layer pattern 620A may be substantially flat.

Then, a junction layer 630 filling a lower portion of the final recess R1', which is where the insulating layer pattern 620A is disposed, may be formed.

Here, the junction layer 630 may include an epitaxial layer grown from the one edge portion of the active region 100A, which is exposed by the forming of the insulating layer pattern 620A. Also, the junction layer 630 may contain impurities with a high concentration.

Then, a contact layer 640 filling a remaining portion of the final recess R1', in which the insulating layer pattern 620A and the junction layer 630 are formed, may be formed.

Unlike the implementation of FIGS. 1 to 2G, in which the junction layer 130 is grown from the two edge portions of the active region 100A, the junction layer 630 of the present implementation may be grown from the one edge portion of the active region 100A that is exposed when forming the insulating layer pattern 620A. An epitaxial layer grown from the two edge portions of the active region 100A may cause a stacking fault at a center point of a bottom surface of the epitaxial layer. However, in the present implementation, since the junction layer 630 includes an epitaxial layer grown from the one edge portion of the active region 100A, a probability that a stacking fault is generated in the epitaxial layer may be lowered, and thus, a quality of the epitaxial layer may be improved.

Figure 7A:
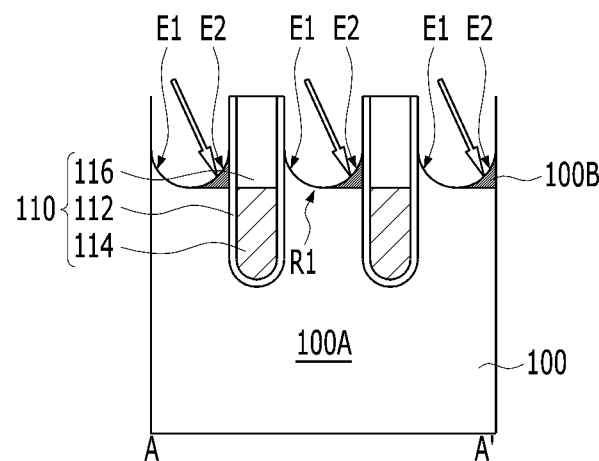
FIGS. 7A and 7B are views illustrating a transistor and a method for fabricating the same in accordance with another implementation of the present disclosure.
Figure 7B:
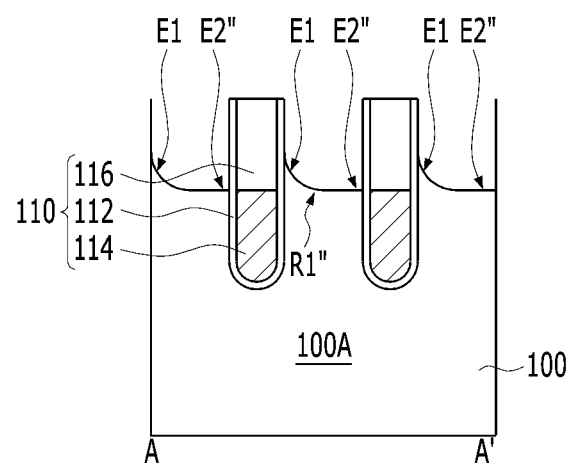

FIGS. 7A and 7B are views illustrating a transistor and a method for fabricating the same in accordance with still another implementation of the present disclosure. Differences from the transistor and the fabricating method thereof shown in FIGS. 1 to 2G will be mainly described.

Referring to FIG. 7A, a gate structure 110 may be formed in a semiconductor substrate 100 by performing the aforementioned processes described with reference to FIGS. 2A to 2C.

Then, an active region 100A located on two sides of the gate structure 110 in a first direction parallel to a line A-A' may be etched to a certain depth to form a recess R1 in the active region 100A.

Here, in the first direction, the recess R1 may have a cross section with a U-shape in which a depth of a bottom surface of the recess R1 increases from two edges of the bottom surface of the recess R1 toward a center of the bottom surface of the recess R1. Hereinafter, for convenience of description, one of the two edges of the bottom surface of the recess R1, for example, a left edge, may be referred to as a first edge E1, and the other of the two edges of the bottom surface of the recess R1, for example, a right edge, may be referred to as a second edge E2. The first edge E1 and the second edge E2 may be located at substantially the same height.

Then, a tilted ion-implantation may be performed toward one of the first and second edges E1 and E2, for example, toward the second edge E2 (see arrows in FIG. 7A). As a result, an impurity region 100B may be formed by the tilted ion-implantation in a portion of the active region 100A, for example, a right portion in the first direction. The impurities injected into the active region 100A by the tilted ion-implantation may increase an etching rate of the semiconductor substrate 100.

Referring to FIG. 7B, the impurity region 100B may be removed. The removal of the impurity region 100B may be performed by a dry etching process or a wet etching process using a gas or chemical, which provides a higher etching rate to the impurity region 100B than the other portions of the active region 100A. Accordingly, a height of the first edge E1 may be maintained, but a height of the second edge E2 may be lowered. As a result, a final recess R1", which has the first edge E1 and a final second edge E2" lower than the second edge E2, may be obtained. The final second edge E2" may be located below the first edge E1. That is, the final recess R1" may have a shape that is substantially the same as the shape of the final recess R1' of FIG. 6C.

Subsequent processes for forming an insulating layer pattern, a junction layer, and a contact layer may be substantially the same as the processes described with reference to FIGS. 6D and 6E, and thus, detailed descriptions thereof will be omitted.

By the present implementation, since a junction layer includes an epitaxial layer grown from one edge portion of the active region 100A, a probability that a stacking fault is generated in the epitaxial layer may be lowered, and thus, a quality of the epitaxial layer may be improved.

The above and other memory circuits or semiconductor devices based on the disclosed technology can be used in a range of devices or systems. FIGS. 8-12 provide some examples of devices or systems that can implement a memory circuit in accordance with an embodiment disclosed herein.

Figure 8:
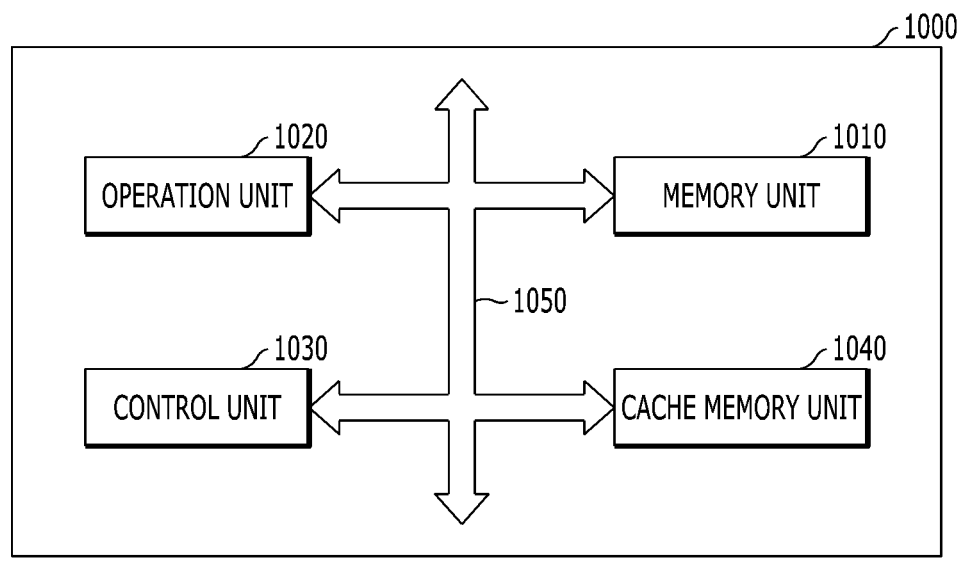
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

At least one of the memory unit 1010, the operation unit 1020 and the control unit 1030 may include one or more of the above-described semiconductor devices in accordance with the implementations. For example, at least one of the memory unit 1010, the operation unit 1020 and the control unit 1030 may include a transistor comprising a semiconductor substrate including an active region which is defined by an isolation layer; a gate structure formed in the semiconductor substrate and crossing the active region; a recess formed in the active region at both sides of the gate structure, a center of a bottom surface of the recess being depressed compared to both edges of the bottom surface of the recess; an insulating layer formed in the recess; and a junction layer formed over the insulating layer in the recess, wherein a top surface of the insulating layer is located below the both edges of the bottom surface of the recess while being flat compared to the bottom surface of the recess. Through this, operating characteristics of at least one of the memory unit 1010, the operation unit 1020 and the control unit 1030 may be improved. As a consequence, operating characteristics of the microprocessor 1000 may be improved.

Figure 9:
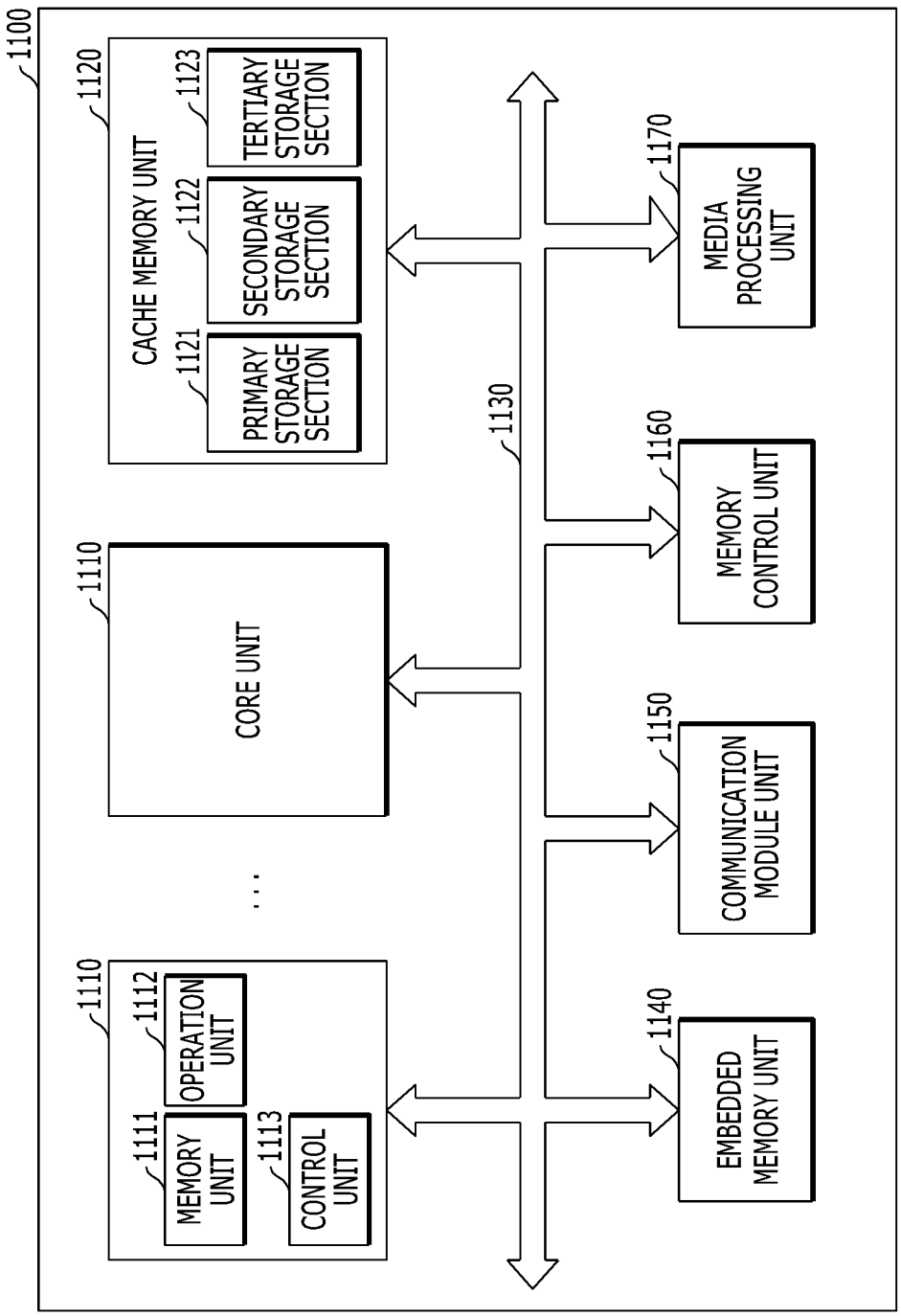
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

At least one of the cache memory unit 1120, the core unit 1110 and the bus interface 1130 may include one or more of the above-described semiconductor devices in accordance with the implementations. For example, at least one of the cache memory unit 1120, the core unit 1110 and the bus interface 1130 may include a transistor comprising a semiconductor substrate including an active region which is defined by an isolation layer; a gate structure formed in the semiconductor substrate and crossing the active region; a recess formed in the active region at both sides of the gate structure, a center of a bottom surface of the recess being depressed compared to both edges of the bottom surface of the recess; an insulating layer formed in the recess; and a junction layer formed over the insulating layer in the recess, wherein a top surface of the insulating layer is located below the both edges of the bottom surface of the recess while being flat compared to the bottom surface of the recess. Through this, operating characteristics of at least one of the cache memory unit 1120, the core unit 1110 and the bus interface 1130 may be improved. As a consequence, operating characteristics of the processor 1100 may be improved.

Figure 10:
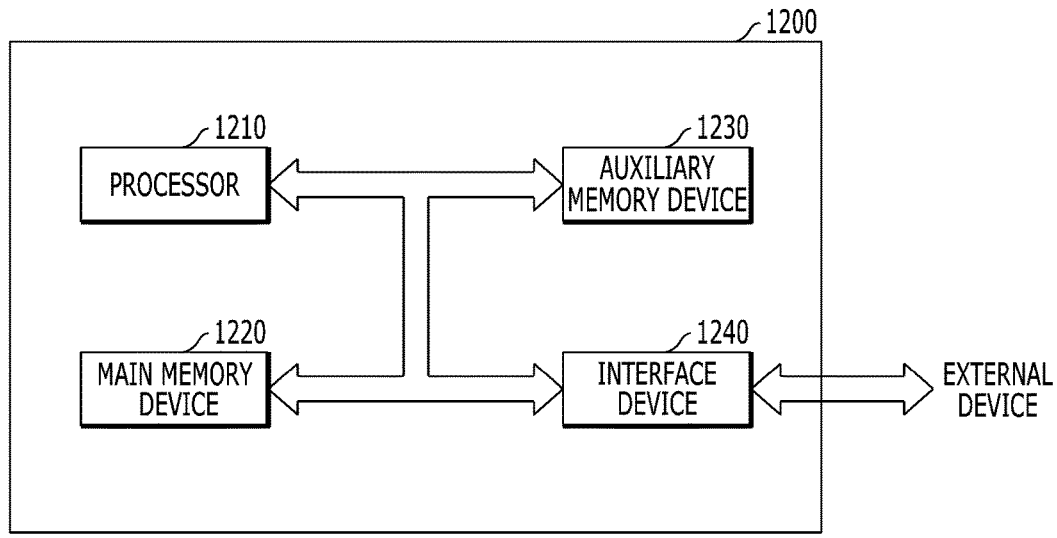
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

At least one of the processor 1210, the main memory device 1220, the auxiliary memory device 1230 and the interface device 1240 may include a transistor comprising a semiconductor substrate including an active region which is defined by an isolation layer; a gate structure formed in the semiconductor substrate and crossing the active region; a recess formed in the active region at both sides of the gate structure, a center of a bottom surface of the recess being depressed compared to both edges of the bottom surface of the recess; an insulating layer formed in the recess; and a junction layer formed over the insulating layer in the recess, wherein a top surface of the insulating layer is located below the both edges of the bottom surface of the recess while being flat compared to the bottom surface of the recess. Through this, operating characteristics of at least one of the processor 1210, the main memory device 1220, the auxiliary memory device 1230 and the interface device 1240 may be improved. As a consequence, operating characteristics of the system 1200 may be improved.

Figure 11:
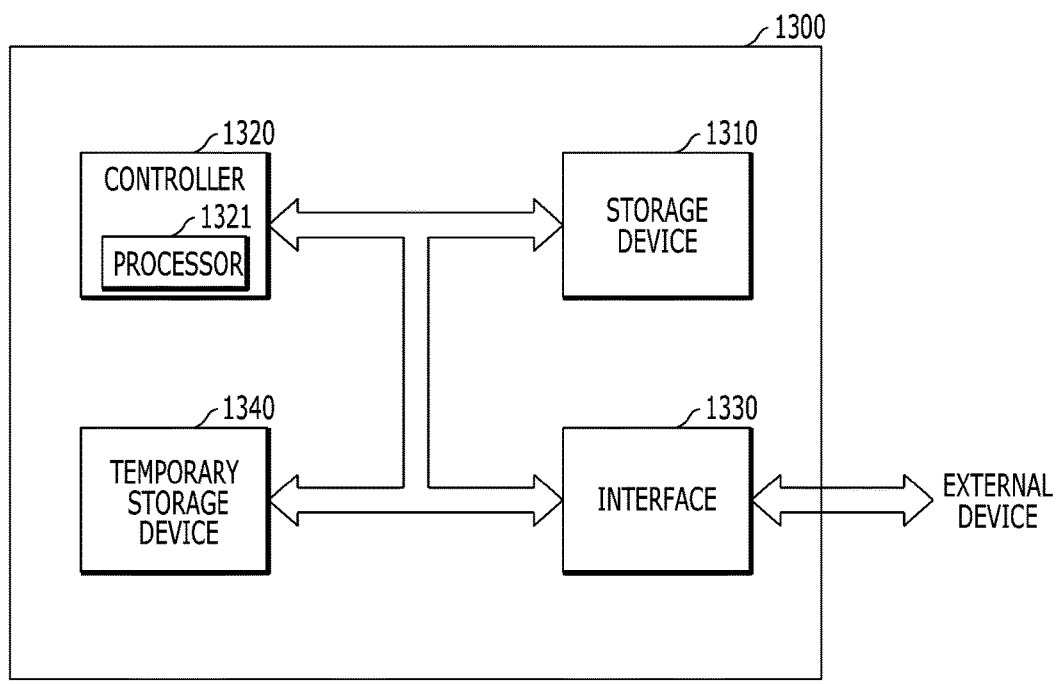
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system.

At least one of the storage device 1310, the controller 1320, the interface 1330 and the temporary storage device 1340 may include one or more of the above-described semiconductor devices in accordance with the implementations. For example, at least one of the storage device 1310, the controller 1320, the interface 1330 and the temporary storage device 1340 may include a transistor comprising a semiconductor substrate including an active region which is defined by an isolation layer; a gate structure formed in the semiconductor substrate and crossing the active region; a recess formed in the active region at both sides of the gate structure, a center of a bottom surface of the recess being depressed compared to both edges of the bottom surface of the recess; an insulating layer formed in the recess; and a junction layer formed over the insulating layer in the recess, wherein a top surface of the insulating layer is located below the both edges of the bottom surface of the recess while being flat compared to the bottom surface of the recess. Through this, operating characteristics of at least one of the storage device 1310, the controller 1320, the interface 1330 and the temporary storage device 1340 may be improved. As a consequence, operating characteristics of the data storage system 1300 may be improved.

Figure 12:
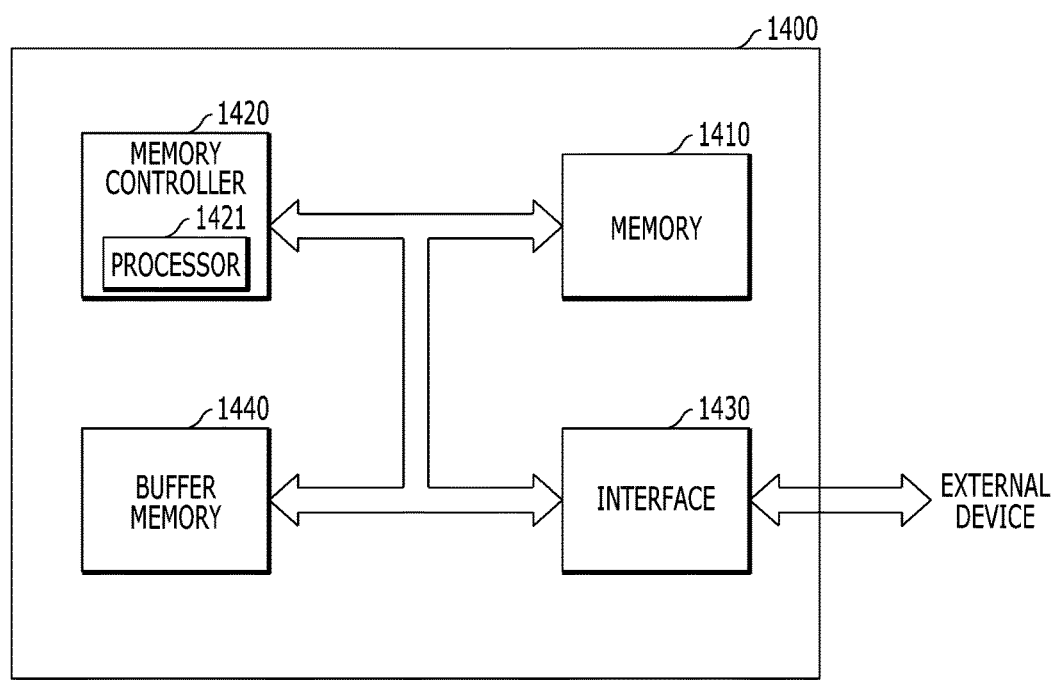
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

At least one of the memory 1410, the memory controller 1420, the interface 1430 and the buffer memory 1440 may include one or more of the above-described semiconductor devices in accordance with the implementations. For example, at least one of the memory 1410, the memory controller 1420, the interface 1430 and the buffer memory 1440 may include a transistor comprising a semiconductor substrate including an active region which is defined by an isolation layer; a gate structure formed in the semiconductor substrate and crossing the active region; a recess formed in the active region at both sides of the gate structure, a center of a bottom surface of the recess being depressed compared to both edges of the bottom surface of the recess; an insulating layer formed in the recess; and a junction layer formed over the insulating layer in the recess, wherein a top surface of the insulating layer is located below the both edges of the bottom surface of the recess while being flat compared to the bottom surface of the recess. Through this, operating characteristics of at least one of the memory 1410, the memory controller 1420, the interface 1430 and the buffer memory 1440 may be improved. As a consequence, operating characteristics of the memory system 1400 may be improved.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a transistor, wherein the transistor comprises:
    a semiconductor substrate including an active region, the active region being defined by an isolation layer and extending in a first direction;
    a gate structure disposed in the semiconductor substrate and crossing the active region in a second direction, the second direction crossing the first direction;
    recesses disposed in the active region on two sides of the gate structure in the first direction, a center of a bottom surface of a first one of the recesses being more depressed in a third direction than two edges of the bottom surface of the first recess along the first direction, the third direction being perpendicular to the first and second directions;
    an insulating layer disposed in the first recess; and
    a junction layer disposed over the insulating layer in the first recess in the third direction,
    wherein a top surface of the insulating layer is located below the two edges of the bottom surface of the first recess, and has a smaller curvature than the bottom surface of the first recess.

2. The electronic device according to claim 1, wherein the junction layer includes an epitaxial layer.

3. The electronic device according to claim 2, wherein the epitaxial layer and the semiconductor substrate include a same semiconductor material.

4. The electronic device according to claim 1, wherein the junction layer includes impurities, and
    wherein the insulating layer prevents the impurities from diffusing into a channel of the transistor.

5. The electronic device according to claim 1, wherein the insulating layer includes one or more of an oxide-based material, a nitride-based material, and a carbon-based material.

6. The electronic device according to claim 1, wherein the transistor further comprises:
    a contact layer located over the junction layer in the third direction.

7. The electronic device according to claim 6, wherein the contact layer includes a metal, a metal compound, or a metal semiconductor compound.

8. The electronic device according to claim 1, further comprising:
    a memory element coupled to the junction layer on a side of the gate structure in the first direction.

9. The electronic device according to claim 8, wherein the memory element includes a variable resistance element, the variable resistance element switching between different resistance states according to an applied voltage or current.

10. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the transistor is part of at least one of the control unit, the operation unit and the memory unit in the microprocessor.

11. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the transistor is part of at least one of the core unit, the cache memory unit and the bus interface in the processor.

12. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside, wherein the transistor is part of at least one of the processor, the auxiliary memory device, the main memory device and the interface device in the processing system.

13. The electronic device according to claim 1, further comprising a data storage system which includes:
- a storage device configured to store data and conserve stored data regardless of power supply;
- a controller configured to control input and output of data to and from the storage device according to a command inputted from an outside;
- a temporary storage device configured to temporarily store data exchanged between the storage device and the outside; and
- an interface configured to perform communication between at least one of the storage device, the controller and the temporary storage device and the outside, wherein the transistor is part of at least one of the controller, the storage device, the temporary storage device and the interface in the data storage system.

14. The electronic device according to claim 1, further comprising a memory system which includes:
- a memory configured to store data and conserve stored data regardless of power supply;
- a memory controller configured to control input and output of data to and from the memory according to a command inputted from an outside;
- a buffer memory configured to buffer data exchanged between the memory and the outside; and
- an interface configured to perform communication between at least one of the memory, the memory controller and the buffer memory and the outside, wherein the transistor is part of at least one of the memory controller, the memory, the buffer memory and the interface in the memory system.

* * * * *